US009449558B2

(12) United States Patent
Choi

(10) Patent No.: US 9,449,558 B2
(45) Date of Patent: Sep. 20, 2016

(54) SCAN DRIVER AND DISPLAY DEVICE USING THE SAME

(71) Applicant: Samsung Display Co., Ltd., Yongin, Gyeonggi-Do (KR)

(72) Inventor: Yang-Hwa Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 93 days.

(21) Appl. No.: 14/579,619

(22) Filed: Dec. 22, 2014

(65) Prior Publication Data

US 2015/0379935 A1    Dec. 31, 2015

(30) Foreign Application Priority Data

Jun. 30, 2014    (KR) .......................... 10-2014-0081293

(51) Int. Cl.
*G09G 3/32*    (2016.01)
*G09G 3/36*    (2006.01)
*G11C 19/28*    (2006.01)

(52) U.S. Cl.
CPC .......... *G09G 3/3266* (2013.01); *G09G 3/3677* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| 8,290,115 | B2 * | 10/2012 | Kim | ..................... | G09G 3/3266 345/204 |
| 9,147,496 | B2 * | 9/2015 | Abe | ..................... | G11C 19/28 |
| 9,208,734 | B2 * | 12/2015 | Qian | ..................... | G11C 19/28 |
| 2008/0062071 | A1 * | 3/2008 | Jeong | ................... | G11C 19/184 345/46 |
| 2010/0158188 | A1 * | 6/2010 | Lee | ...................... | G09G 3/3677 377/79 |
| 2012/0169709 | A1 * | 7/2012 | Lee | ...................... | G09G 3/3677 345/215 |
| 2012/0194773 | A1 * | 8/2012 | Kim | .................... | G02F 1/13336 349/139 |
| 2013/0127805 | A1 * | 5/2013 | Chung | ................. | G09G 3/3266 345/211 |
| 2013/0207956 | A1 * | 8/2013 | Jang | ..................... | G09G 3/3266 345/212 |
| 2014/0043373 | A1 * | 2/2014 | Kim | ........................ | G09G 3/02 345/690 |

FOREIGN PATENT DOCUMENTS

| KR | 10-2011-0080385 A | 7/2011 |
| KR | 10-2012-0019228 A | 3/2012 |
| KR | 10-2013-0051750 A | 5/2013 |
| KR | 10-2013-0092814 A | 8/2013 |

* cited by examiner

*Primary Examiner* — Antonio Xavier
(74) *Attorney, Agent, or Firm* — Knobbe Martens Olson & Bear LLP

(57) ABSTRACT

A scan driver and display device using the same are disclosed. In one aspect, the scan driver includes a plurality of stages. Each stage includes a first transistor electrically connected between a first voltage input terminal and an output terminal, wherein the first transistor comprises a gate electrode electrically connected to a first node. Each stage also includes a second transistor electrically connected between the output terminal and a second clock signal input terminal and having a gate electrode electrically connected to a second node. Furthermore, each stage includes third and fourth transistors electrically connected in series. Each stage further includes a fifth transistor having first and second electrodes and a gate electrode electrically connected to the second node, the first electrode is electrically connected between the third and fourth transistors, and the second electrode is electrically connected to a second voltage input terminal configured to receive a second voltage.

20 Claims, 5 Drawing Sheets

SCAN DRIVER AND DISPLAY DEVICE USING THE SAME

CROSS-REFERENCE TO RELATED APPLICATION

This application claims priority to and the benefit of Korean Patent Application No. 10-2014-0081293 filed in the Korean Intellectual Property Office on Jun. 30, 2014, the entire contents of which are incorporated herein by reference.

BACKGROUND

1. Field

The described technology generally relates to a scan driver and a display device using the same.

2. Description of the Related Technology

A display device applies an enable-level scan signal to a plurality of scan lines and applies a data signal that corresponds to the enable-level scan line to a plurality of data line in order to display an image.

A scan driver can include a plurality of stages for outputting the enable-level scan signal. The stages can be sequentially arranged, and an enable-level scan signal output by one stage can be applied as an input signal to another stage.

Each stage outputs the scan signal according to receiving of a plurality of input signals, and includes a plurality of transistors and capacitors.

SUMMARY OF CERTAIN INVENTIVE ASPECTS

One inventive aspect is a scan driving device that is robust on a drain-induced barrier lowering (DIBL) phenomenon of a transistor.

Another aspect is a scan driving device that includes a plurality of stages for outputting a scan signal to a corresponding scan line, wherein each stage includes: a first transistor connected between a first voltage input terminal for receiving a first voltage and an output terminal for outputting the scan signal, a gate being connected to a first node; a second transistor connected between the output terminal and a second clock signal input terminal, a gate being connected to a second node; a third transistor and a fourth transistor connected in series between an input terminal for receiving an input signal and the second node, a gate being connected to the first clock signal input terminal; and a fifth transistor connected between a contact point of the third transistor and the fourth transistor and a second voltage input terminal for receiving a second voltage, a gate being connected to the second node.

The scan driving device further includes a sixth transistor and a seventh transistor connected in series between the second voltage input terminal for receiving a second voltage and the first node, a gate being connected to the first clock signal input terminal.

The scan driving device further includes: an eighth transistor and a ninth transistor connected in series between the first voltage input terminal and the second node, a gate being connected to the first node; and a tenth transistor connected between a contact point of the sixth transistor and the seventh transistor and the second voltage input terminal for receiving a second voltage, a gate being connected to the second node.

The scan driving device further includes an eleventh transistor connected between the sixth transistor, the seventh transistor, and the second node, a gate being connected to the second clock signal input terminal.

The scan driving device further includes a twelfth transistor connected between the first node and the first clock signal input terminal, a gate being connected to the second node.

The scan driving device further includes a first capacitor connected between the output terminal and the second node.

The scan driving device further includes a second capacitor connected between the first voltage input terminal and the first node.

When the input signal and the first clock signal are enabled during a first period and the second clock signal is enabled during a second period, the scan signal is output.

An output terminal of a present stage is connected to an input terminal of a next stage.

Another aspect is a display device including: a display unit including a plurality of pixels connected to a corresponding scan line; and a scan driver including a plurality of stages for outputting a scan signal to the scan line. One of the plurality of stages includes: a first transistor connected between a first voltage input terminal for receiving a first voltage and an output terminal for outputting the scan signal, a gate being connected to a first node; a second transistor connected between the output terminal and a second clock signal input terminal, a gate being connected to a second node; a third transistor and a fourth transistor connected in series between an input terminal for receiving an input signal and the second node, a gate being connected to the first clock signal input terminal; and a fifth transistor connected between a contact point of the third transistor and the fourth transistor and a second voltage input terminal for receiving a second voltage, a gate being connected to the second node.

One of the plurality of stages further includes a sixth transistor and a seventh transistor connected in series between the second voltage input terminal for receiving a second voltage and the first node, a gate being connected to the first clock signal input terminal.

One the plurality of stages further includes: an eighth transistor and a ninth transistor connected in series between the first voltage input terminal and the second node, a gate being connected to the first node; and a tenth transistor connected between a contact point of the sixth transistor and the seventh transistor and the second voltage input terminal for receiving a second voltage, a gate being connected to the second node.

One the plurality of stages further includes an eleventh transistor connected between the sixth transistor, the seventh transistor, and the second node, a gate being connected to the second clock signal input terminal.

One the plurality of stages further includes a twelfth transistor connected between the first node and the first clock signal input terminal, a gate being connected to the second node.

One the plurality of stages further includes a first capacitor connected between the output terminal and the second node.

One the plurality of stages further includes a second capacitor connected between the first voltage input terminal and the first node.

Regarding one of the plurality of stages, when the input signal and the first clock signal are enabled during a first period and the second clock signal is enabled during a second period, the scan signal is output.

An output terminal from among the plurality of stages is connected to an input terminal of a next stage.

The display device further includes a power voltage supplier for supplying the first voltage and the second voltage to the scan driver.

According to at least one of the disclosed embodiments, the scan signal with an accurate and stabilized waveform can be supplied. Furthermore, the DIBL phenomenon is reduced.

A scan driver comprising a plurality of stages each configured to output a scan signal to a corresponding scan line, wherein each stage includes a first transistor electrically connected between a first voltage input terminal configured to receive a first voltage and an output terminal configured to output the scan signal, wherein the first transistor comprises a gate electrode electrically connected to a first node. Each stage also includes a second transistor electrically connected between the output terminal and a second clock signal input terminal and having a gate electrode electrically connected to a second node. Each stage further includes third and fourth transistors electrically connected in series between an input terminal configured to receive an input signal and the second node, wherein each of the third and fourth transistors comprises a gate electrode electrically connected to the first clock signal input terminal. Furthermore, each stage includes a fifth transistor having first and second electrodes and a gate electrode electrically connected to the second node, wherein the first electrode is electrically connected between the third and fourth transistors, and wherein the second electrode is electrically connected to a second voltage input terminal configured to receive a second voltage.

The above scan driver further comprises sixth and seventh transistors electrically connected in series between the second voltage input terminal for receiving a second voltage and the first node, wherein each of the sixth and seventh transistors comprise a gate electrode electrically connected to the first clock signal input terminal.

The above scan driver further comprises eighth and ninth transistors electrically connected in series between the first voltage input terminal and the second node, wherein each of the eighth and ninth transistors comprises a gate electrode electrically connected to the first node. The above scan driver further comprises a tenth transistor having first and second electrodes and a gate electrode electrically connected to the second node, wherein the first electrode is electrically connected between the eighth and ninth transistors, and wherein the second electrode is electrically connected to the second voltage input terminal.

The above scan driver further comprises an eleventh transistor electrically connected between the ninth transistor and the second node and having a gate electrode electrically connected to the second clock signal input terminal.

The above scan driver further comprises a twelfth transistor electrically connected between the first node and the first clock signal input terminal and having a gate electrode electrically connected to the second node.

The above scan driver further comprises a first capacitor electrically connected between the output terminal and the second node.

The above scan driver further comprises a second capacitor electrically connected between the first voltage input terminal and the first node.

In the above scan driver, each stage is further configured to output the scan signal when the input signal and the first clock signal have an enable voltage level during a first period and the second clock signal have the enable voltage level during a second period.

In the above scan driver, an output terminal of a selected stage is electrically connected to an input terminal of the next stage.

Another aspect is a display device comprising a display unit comprising a plurality of pixels each electrically connected to a corresponding scan line and a scan driver comprising a plurality of stages each configured to output a scan signal to the corresponding scan line. Each stage includes a first transistor electrically connected between a first voltage input terminal configured to receive a first voltage and an output terminal configured to output the scan signal, wherein the first transistor comprises a gate electrode electrically connected to a first node. Each stage also includes a second transistor electrically connected between the output terminal and a second clock signal input terminal and having a gate electrode electrically connected to a second node. Each stage further includes third and fourth transistors electrically connected in series between an input terminal configured to receive an input signal and the second node, wherein each of the third and fourth transistors comprises a gate electrode electrically connected to the first clock signal input terminal. Furthermore, each stage includes a fifth transistor having first and second electrodes and a gate electrode electrically connected to the second node, wherein the first electrode is electrically connected between the third and fourth transistors, and wherein the second electrode is electrically connected to a second voltage input terminal configured to receive a second voltage.

In the above display device, each stage further comprises sixth and seventh transistors electrically connected in series between the second voltage input terminal and the first node, and wherein each of the sixth and seventh transistors comprises a gate electrode electrically connected to the first clock signal input terminal.

In the above display device, each stage further comprises eighth and ninth transistors electrically connected in series between the first voltage input terminal and the second node, wherein each of the eighth and ninth transistors comprises a gate electrode electrically connected to the first node. In the above display device, each stage further comprises a tenth transistor having first and second electrodes and a gate electrode electrically connected to the second node, wherein the first electrode is electrically connected between the eighth and ninth transistors, and wherein the second electrode is electrically connected to the second voltage input terminal.

In the above display device, each stage further comprises an eleventh transistor electrically connected between the ninth transistor and the second node and having a gate electrode electrically connected to the second clock signal input terminal.

In the above display device, each stage further comprises a twelfth transistor electrically connected between the first node and the first clock signal input terminal and having a gate electrode electrically connected to the second node.

In the above display device, each stage further comprises a first capacitor electrically connected between the output terminal and the second node.

In the above display device, each stage further comprises a second capacitor electrically connected between the first voltage input terminal and the first node.

In the above display device, each stage is further configured to output the scan signal when the input signal and the first clock signal have an enable voltage level during a first period and the second clock signal have the enable voltage level during a second period.

In the above display device, the output terminal of a selected stage is electrically connected to the input terminal of a next stage.

The above display device further comprises a power voltage supplier configured to supply the first and second voltages to the scan driver.

The above display device further comprises a timing controller electrically connected to the scan driver and configured to i) receive an image signal, a data enable signal, horizontal and vertical synchronizing signals, and a main clock signal, and ii) output an image data signal and first and second control signals based at least in part on the received signals. The above display device further comprises a data driver electrically connected to the pixels through a plurality of data lines and configured to receive the image data signal from the timing controller, wherein the timing controller is configured to control i) the scan driver based at least in part on the first control signal and ii) the data driver based at least in part on image data signal and the second control signal.

DETAILED DESCRIPTION OF CERTAIN INVENTIVE EMBODIMENTS

Figure 1:
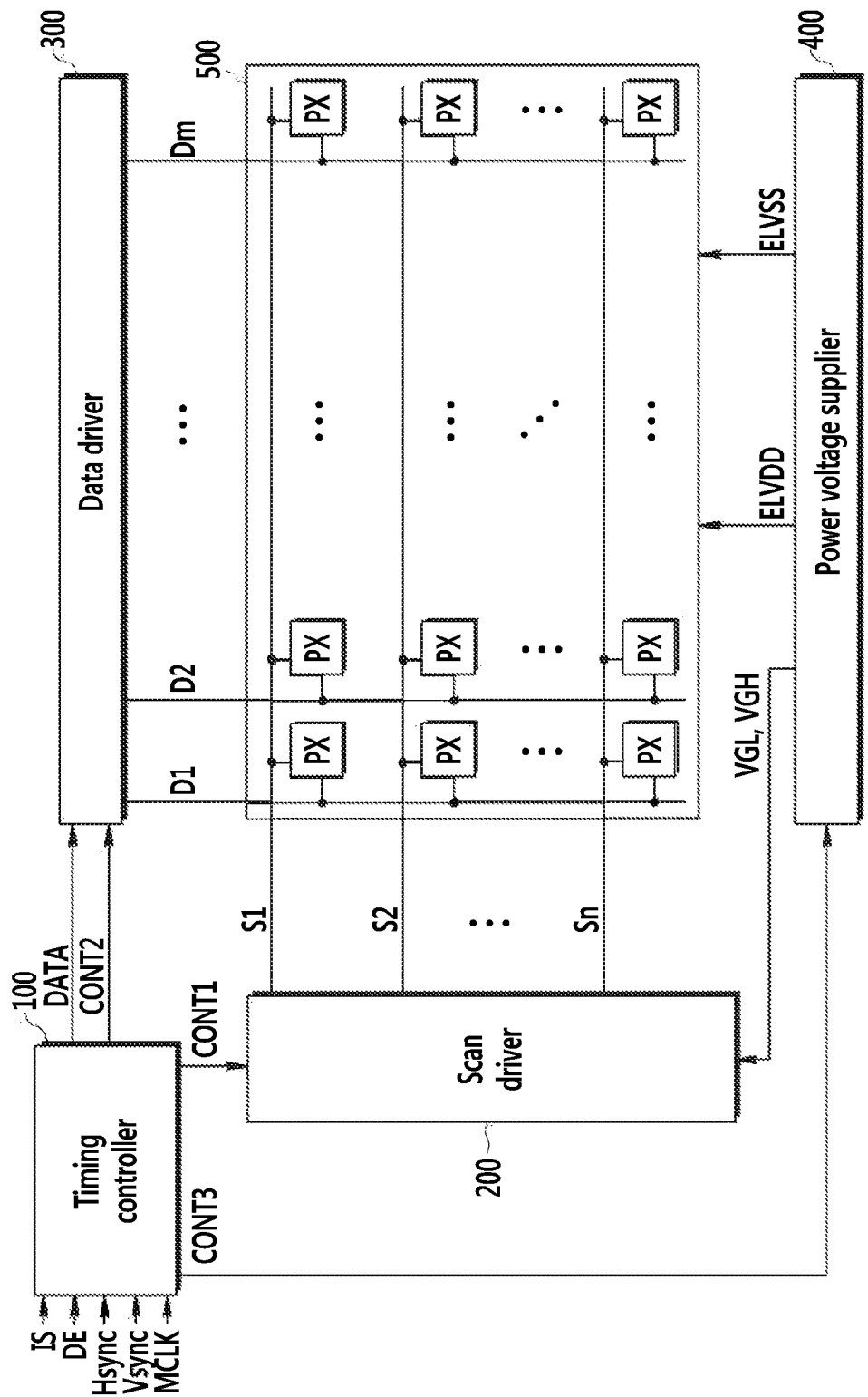
FIG. 1 shows a block diagram of a display device according to an exemplary embodiment.

Recently, as display devices have become larger, there is a greater need for a scan driver included in the display devices to output a scan signal with an accurate and stabilized waveform. Methods for reducing a leakage current occurring at a transistor in the scan driver are also being studied.

Hereinafter, exemplary embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier. Therefore, these terms do not have meanings or roles that distinguish them from each other by themselves. In describing exemplary embodiments of the present specification, when it is determined that a detailed description of the well-known art associated with the described technology can obscure the gist of the described technology, it will be omitted. The accompanying drawings are provided only in order to allow exemplary embodiments disclosed in the present specification to be easily understood and are not to be interpreted as limiting the spirit disclosed in the present specification, and it is to be understood that the described technology includes all modifications, equivalents, and substitutions without departing from the scope and spirit of the described technology.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it can be connected or coupled directly to another component or be connected or coupled to another component with the other component intervening therebetween. On the other hand, it is to be understood that when one component is referred to as being "connected or coupled directly" to another component, it can be connected to or coupled to another component without the other component intervening therebetween.

Singular forms are to include plural forms unless the context clearly indicates otherwise.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof. In this disclosure, the term "substantially" includes the meanings of completely, almost completely or to any significant degree under some applications and in accordance with those skilled in the art. Moreover, "formed on" can also mean "formed over." The term "connected" can include an electrical connection.

A display device according to an exemplary embodiment will now be described in detail with reference to FIG. 1.

FIG. 1 shows a block diagram of a display device according to an exemplary embodiment. Referring to FIG. 1, the display device includes a display unit 500, a scan driver 200 electrically connected to the display unit 500, a data driver 300, a power voltage supplier 400, and a timing controller 100 for controlling the aforementioned components.

The display unit 500 includes a plurality of display signal lines (S1-Sn, D1-Dm), and a plurality of pixels PX electrically connected to the display signal lines. The pixels PX are substantially arranged in a matrix form. The display unit 500 can include lower and upper panels (not shown) facing each other.

The display signal lines (S1-Sn, D1-Dm) include a plurality of scan lines (S1-Sn) for transmitting a scan signal (also called a gate signal) and a plurality of data lines (D1-Dm) for transmitting a data signal. The scan lines (S1-Sn) are extended substantially in a row direction and are substantially parallel with each other. The data lines (D1-Dm) are extended substantially in a column direction and are substantially parallel with each other.

The scan driver 200 is electrically connected to the scan lines (S1-Sn) and applies a scan signal including an enable level or a disable level to the scan lines (S1-Sn). An enable-level scan signal is applied to a gate of a transistor to turn on the transistor, and a disable-level scan signal is applied to the gate of the transistor to turn off the transistor.

A first drive control signal CONT1 is an operation control signal of the scan driver 200 generated and transmitted by the timing controller 100. The first drive control signal CONT1 can include a scan start signal, a first clock signal, and a second clock signal. The scan start signal generates a first scan signal for displaying an image of one frame. The first clock signal and the second clock signal are synchronization signals for sequentially applying the scan signal to the scan lines (S1-Sn).

The data driver 300 is connected to the pixels PX through the data lines (D1-Dm). The data driver 30 receives an image data signal (DATA) and transmits the same to the corresponding one of the data lines (D1-Dm) based at least in part on a data control signal CONT2.

The data driver 300 samples and holds the image data signal (DATA) based at least in part on the second drive control signal CONT2, and transmits the data signals to the data lines (D1-Dm). The data driver 30 applies the data signal having a predetermined voltage range to the data lines (D1-Dm) corresponding to the enable-level scan signal.

The power voltage supplier 400 is electrically connected to a plurality of power lines, and supplies a first power voltage (ELVDD) and a second power voltage (ELVSS) to the power lines. The power voltage supplier 400 can supply a first voltage (VGH) and a second voltage (VGL) to the scan driver.

The first power voltage (ELVDD) and the second power voltage (ELVSS) supply a driving voltage for operating the pixels PX. The first voltage (VGH) and the second voltage (VGL) are voltages for operating the scan driver. In some embodiments, the first power voltage (ELVDD) can have substantially the same level as the first voltage (VGH), and the second power voltage (ELVSS) can have substantially the same level as the second voltage (VGL).

The timing controller 100 controls the scan driver 200, the data driver 300, and the power voltage supplier 400.

The timing controller 100 receives an image signal (IS) and an input control signal for controlling the displaying of the image signal (IS). The image signal (IS) includes luminance information on the respective pixels PX of the display unit 500, and the luminance can be classified into a predetermined number of grayscale levels such as 1024, 256, or 64 levels.

The input control signal exemplarily includes a vertical synchronization signal Vsync, a horizontal synchronizing signal Hsync, a main clock signal (MCK), and a data enable signal DE.

The timing controller 100 generates the first to third drive control signals (CONT1, CONT2, and CONT3) and an image data signal (DATA) based at least in part on the image signal (IS), the horizontal synchronizing signal Hsync, the vertical synchronization signal Vsync, and the main clock signal (MCK).

The timing controller 100 uses the image signal (IS) and the input control signal to image-process the image display signal (IS) based at least in part on operational conditions of the display unit 500 and the data driver 300. The image-processing can include a gamma correction operation or luminance compensation operation on the image display signal (IS) to generate the image data signal (DATA).

The timing controller 100 transmits the first drive control signal CONT1 for controlling the scan driver 200 to the scan driver 200. In addition, the timing controller 100 generates the second drive control signal CONT2 for controlling the data driver 300, and transmits it together with the image-processed image data signal (DATA) to the data driver 300.

The pixel PX can include a transistor (not shown) having a gate electrically connected to the corresponding scan lines (S1-Sn) and a source and a drain electrically connected to the data lines (D1-Dm). The transistor can transmit the data signal provided from the data line in response to the enable-level scan signal provided from the scan line. The pixel PX can include a light emitting region (not shown) for expressing a gray based at least in part on the data signal provided by the transistor.

In this instance, when the display device is a liquid crystal display (LCD), the light emitting region can include a capacitor for storing a data signal, and a liquid crystal layer for expressing a gray based at least in part on the data signal stored in the capacitor.

When the display device is an organic light-emitting diode (OLED) device, the light emitting region can include a capacitor for storing a data signal, a driving transistor for transmitting a current based at least in part on the data signal stored in the capacitor, and an OLED for expressing a gray based at least in part on a current provided by the driving transistor.

The drivers (100, 200, 300, and 400) can be mounted as at least one integrated circuit on the display unit 500, installed on a flexible printed circuit film (not shown), attached as a tape carrier package (TCP) to the display unit 500, or mounted on an additional printed circuit board (PCB) (not shown). The drivers 200, 300, and 400 can be integrated on the display unit 500 together with the signal lines (S1-Sn, D1-Dm) and the transistor. The drivers 200, 300, and 400 can be integrated into a single chip, and at least one of them or at least one circuit element configuring them can be provided outside the single chip.

Figure 2:
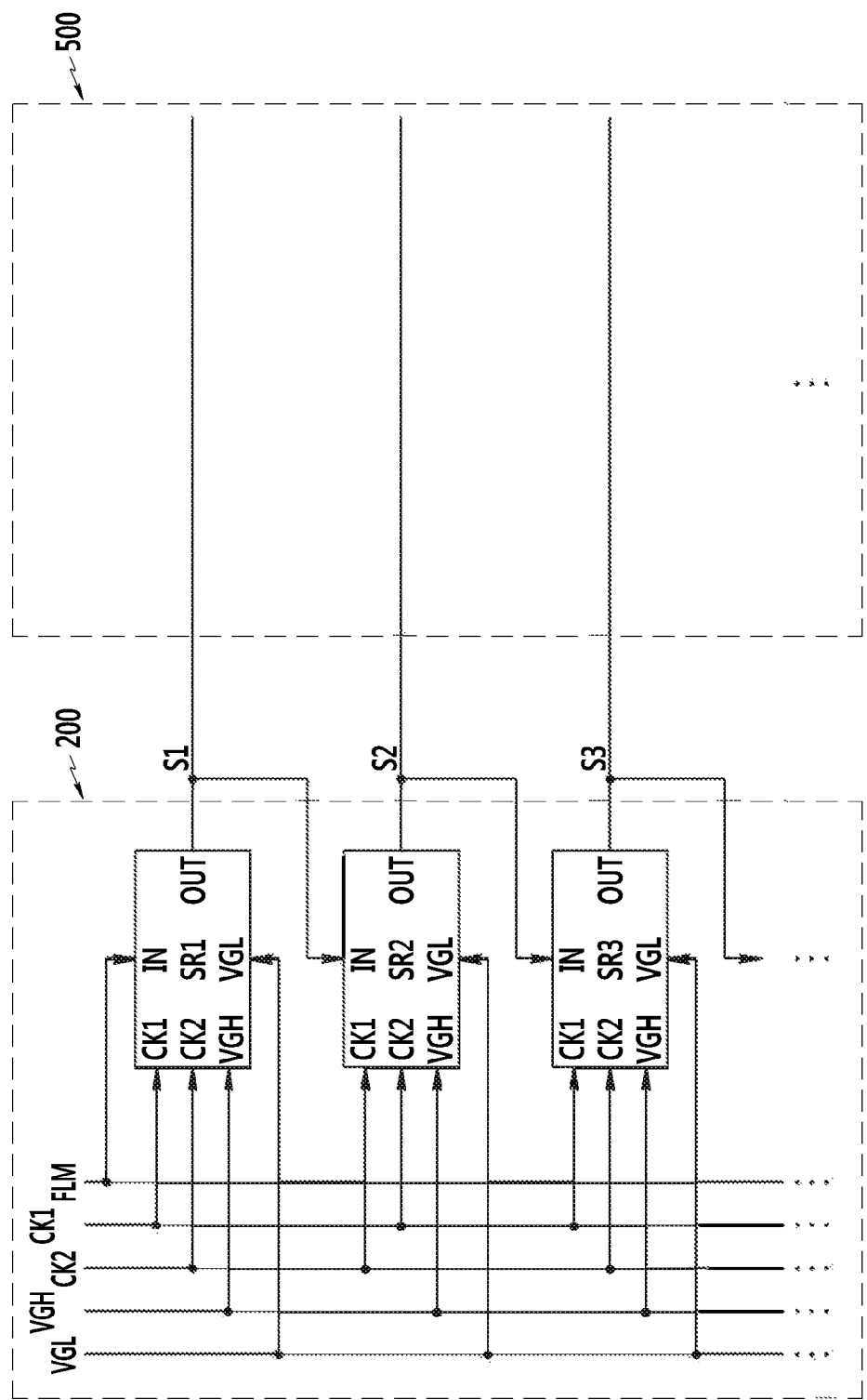
FIG. 2 shows a block diagram of a scan driving device according to an exemplary embodiment.

Referring to FIG. 2, the scan driver 200 of FIG. 1, that is, the scan driving device, includes a plurality of stages (SR1-SRn) and receives a first voltage (VGH), a second voltage (VGL), at least of one of the clock signals CK1 and CK2, and the scan start signal (FLM). The stages (SR1-SRn) are respectively electrically connected to the scan lines (S1-Sn). The stages (SR1-SRn) output the scan signals (scan[1]-scan[n]) to the corresponding scan lines (S1-Sn).

Each stage, for example, an i-th stage (SRi) includes an input terminal (IN), an output terminal (OUT), clock signal input terminals CK1 and CK2, a first voltage input terminal (VGH), and a second voltage input terminal (VGL).

A high voltage (VGH) and a low voltage (VGL) are respectively applied to the first voltage input terminal (VGH) and the second voltage input terminal (VGL) of the i-th stage (SRi).

The clock signals CK1 and CK2 are alternately input to the clock signal input terminals CK1 and CK2. That is, the first clock signal CK1 is input to the first clock signal input terminal CK1 of the i-th stage (SRi), the second clock signal CK2 is input to the second clock signal input terminal CK2, the second clock signal CK2 is input to the first clock signal input terminal CK1 of the (i+1)-th stage (SRi+1), and the first clock signal CK1 is input to the second clock signal input terminal CK2.

The output terminal (OUT) of the i-th stage (SRi) transmits an enable-level or disable-level scan signal (scan[i]) to the corresponding scan line (Si). The output terminal (OUT) of the previous stage (SRi−1) is electrically connected to an input terminal (IN) of the i-th stage (SRi) to input a scan signal (scan[i−1]) of the previous stage (SRi−1) (e.g., a previous output signal) thereto. The output terminal (OUT) of the i-th stage (SRi) is electrically connected to an input terminal (IN) of a next stage (SRi+1) to transmit the scan signal (scan[i]).

However, the scan start signal (FLM) is input to the input terminal (IN) of the first stage SR1. An output terminal (OUT) of the final stage (SRn) can be electrically connected to the corresponding scan line (Sn).

When a time for scanning a scan line is set to be one horizontal period 1H, the clock signals CK1 and CK2 have a period of 2H, a duty ratio is 1/2, and a phase difference between two neighboring clock signals is 1H. Therefore, when one of the two clock signals CK1 and CK2 has the enable level, the other clock signal can have the disable level.

Figure 3:
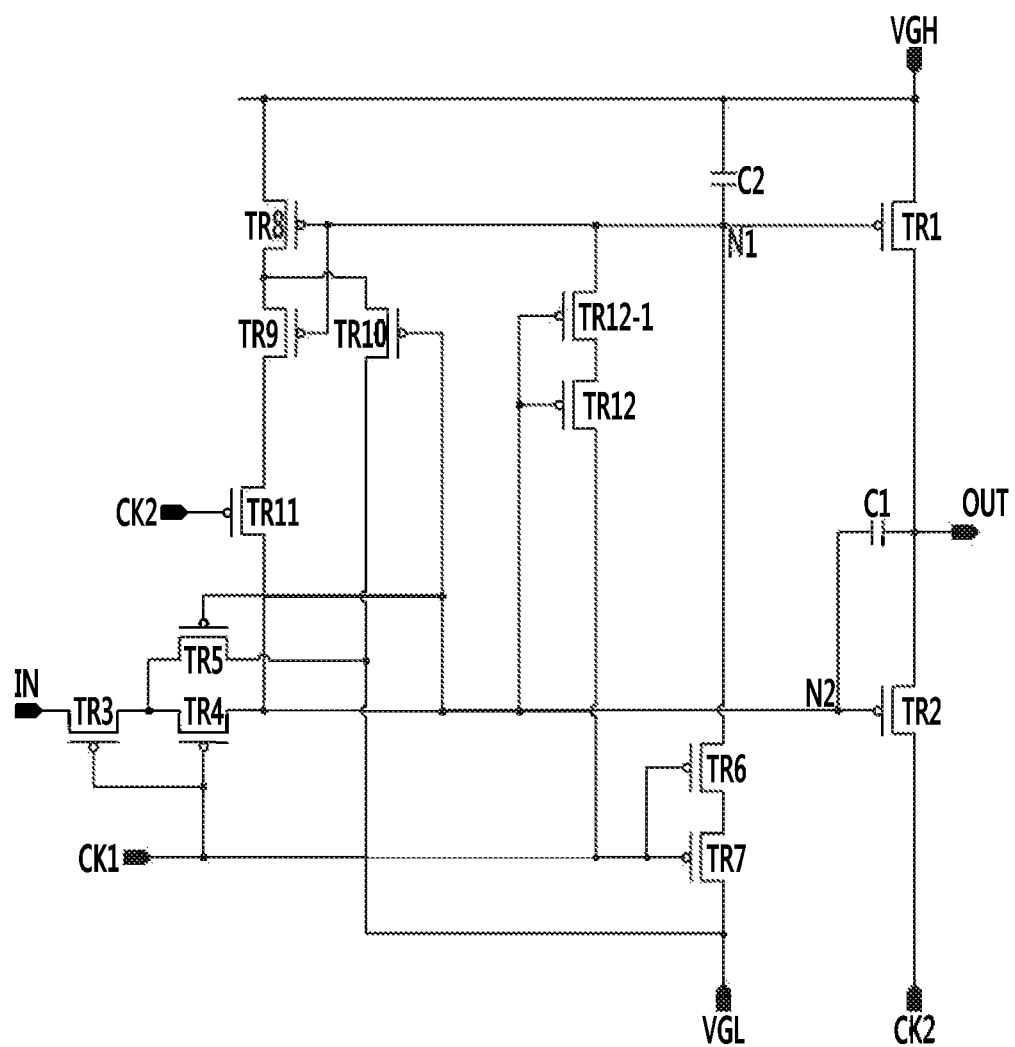
FIG. 3 shows a circuit diagram of a stage of a scan driving device according to an exemplary embodiment.

Referring to FIG. 3, each stage, for example, the i-th stage (SRi), includes first to twelfth transistors (TR1-TR12), a first capacitor C1, and a second capacitor C2. The first to twelfth transistors (TR1-TR12) include p-channel metal-oxide semiconductor (PMOS) transistors. When the PMOS transistors are used, the enable-level voltage is a low voltage and the disable-level voltage is a high voltage. Differing from this, the transistors (TR1-TR12) can be formed with n-channel metal-oxide semiconductor (NMOS) transistors, and in this case, the enable-level voltage is the high voltage and the disable-level voltage is the low voltage.

The first transistor TR1 is electrically connected between the first voltage input terminal (VGH) to which a first voltage is supplied and an output terminal (OUT) for outputting a scan signal. A gate of the first transistor TR1 is electrically connected to a first node N1. The second transistor TR2 is electrically connected between the output terminal (OUT) and the second clock signal input terminal CK2. A gate of the second transistor TR2 is electrically connected to a second node N2.

The third transistor TR3 and the fourth transistor TR4 can be electrically connected in series between an input terminal (IN) for receiving an input signal and the second node N2. Gates of the third and fourth transistors TR3 and TR4 are electrically connected to the first clock signal input terminal CK1. The fifth transistor TR5 is electrically connected between an electrical connection point between the third and fourth transistors TR3 and TR4, and the second voltage input terminal (VGL). A gate of the fifth transistor TR5 is electrically connected to the second node N2.

The sixth and seventh transistors TR6 and TR7 are electrically connected in series between the second voltage input terminal (VGL) and the first node N1. Gates of the sixth and seventh transistors TR6 and TR7 are electrically connected to the first clock signal input terminal CK1.

The eighth and ninth transistors TR8 and TR9 are electrically connected in series between the first voltage input terminal (VGH) and the second node N2. Gates of the eighth and ninth transistors TR8 and TR9 are electrically connected to the first node N1.

The tenth transistor TR10 is electrically connected between an electrical connection point between the eighth and ninth transistors TR8 and TR9, and the second voltage input terminal (VGL). A gate of the tenth transistor is electrically connected to the second node N2.

The eleventh transistor TR11 is electrically connected between the eighth transistor TR8, the ninth transistor TR9, and the second node N2. A gate of the eleventh transistor TR11 is electrically connected to the second clock signal input terminal CK2.

The twelfth transistor TR12 is electrically connected between the first node N1 and the first clock signal input terminal CK1. A gate of the twelfth transistor is electrically connected to the second node N2. In this instance, the twelfth transistor TR12 is configured with a plurality of transistors (TR12, TR12-1) coupled in series.

The first capacitor C1 is electrically connected between the output terminal (OUT) and the second node N2. The second capacitor C2 is electrically connected between the first voltage input terminal (VGH) and the first node N1.

An operation of a scan driving device 200 according to an exemplary embodiment will now be described with reference to FIG. 4 and FIG. 5.

Figure 4:
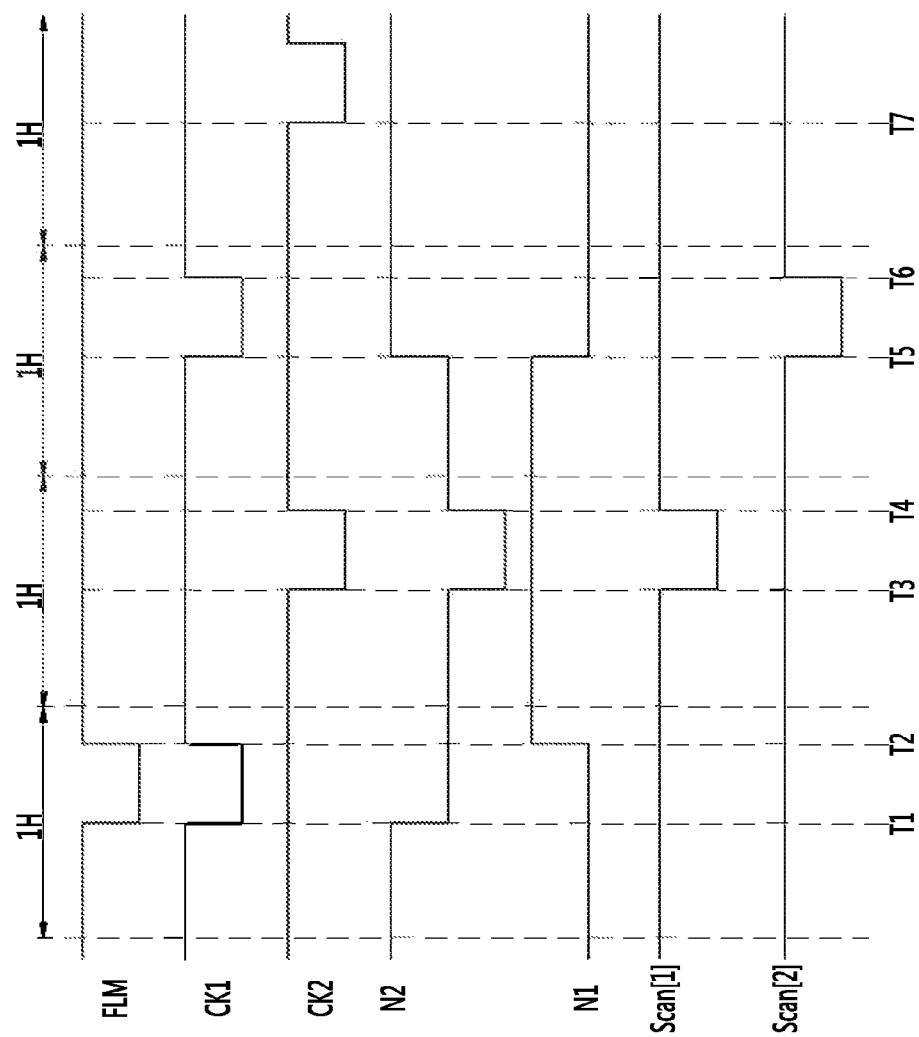
FIG. 4 shows a signal timing diagram of a scan driving device according to an exemplary embodiment.

FIG. 4 shows a signal timing diagram of the scan driving device 200 according to an exemplary embodiment. FIG. 5 shows an exemplary diagram of a leakage current of a transistor base at least in part on a voltage applied to a drain, a source, and a gate.

For convenience of description in FIG. 4, it will be assumed that the disable levels of the input signal (IN) and the clock signals CK1 and CK2 correspond to the first voltage (VGH) of the first voltage input terminal (VGH). It will also be assumed that the enable levels correspond to the second voltage (VGL) of the second voltage input terminal (VGL). It will be further assumed that the transistor of each stage (SRi) is turned off in response to the disable levels of the input signal (IN) and the clock signals CK1 and CK2, that is, the high voltage, and the transistor of each stage (SRi) is turned on in response to the enable levels of the input signal (IN) and the clock signals CK1 and CK2, that is, the low voltage. Hereinafter, it will be assumed that the enable level has a voltage of about −7 V and the disable level has a voltage of about 6 V.

A scan operation of the scan driver 200, that is, an operation of the shift register SR1, will now be described with reference to FIG. 4.

Referring to FIG. 4, at the time T1, an enable-level scan start signal (FLM) is applied within a period of 1H to start a scan operation. At T1, the first clock signal CK1 is at the enable level and the second clock signal CK2 is at the disable level, so that the input terminal (IN) and the first clock signal input terminal CK1 become the low voltage and the second clock signal input terminal CK2 becomes the high voltage in the first stage SR1.

The third and fourth transistors TR3 and TR4 are turned on to switch the second node N2 to the low voltage, turn on the sixth and seventh transistors TR6 and TR7, and maintain the first node N1 at the low voltage.

The twelfth transistor TR12 is accordingly turned on to transmit the enable-level first clock signal CK1 to the first node. The first transistor TR1 is turned on to maintain the scan signal output to the output terminal (OUT) at the first voltage (VGH).

The fifth and tenth transistors TR5 and TR10 are turned on.

At time T2, when the scan start signal (FLM) and the first clock signal CK1 are changed to the disable level, the third, fourth, sixth, and seventh transistors TR3, TR4, TR6 and TR7 are turned off to make the second node N2 float and store a voltage that corresponds to a difference between the high voltage and the low voltage into the capacitor C1.

The twelfth transistors (TR12, TR12-1) are turned on, and the first clock signal CK1 that is changed to the disable level is transmitted to the first node N1. The first node N1 is switched to the high level and the eighth and ninth transistors TR8 and TR9 are turned off.

At time T3, when the enable-level second clock signal CK2 is applied to the second clock signal input terminal CK2, the voltage of the second node N2 (assumed to be about −12 V) becomes lower than the low voltage (VGL) due to bootstrapping by the first capacitor C1. The second transistor TR2 is turned on, and the voltage at the output terminal (OUT) becomes the low voltage (VGL). The first stage SR1 outputs the low voltage (VGL), that is, an enable-level scan signal (scan[1]).

The enable-level scan signal (scan[1]) is applied to the input terminal (IN) of the next stage SR2. The second clock signal CK2 is applied to the first clock signal input terminal CK1 of the next stage SR2.

As described, during the period T3 to T4, the stage SR1 maintains the input of the low voltage provided and turns on the transistor TR2 to output the low voltage of the second clock signal CK2 as the scan signal (scan[1]).

However, when the second node N2 lowers to a voltage that is less than the low voltage (VGL), the second node N2 cannot maintain the voltage that is lower than the low voltage (VGL) based at least in part on a characteristic of the transistor, which will be described with reference to FIG. 5.

Figure 5:
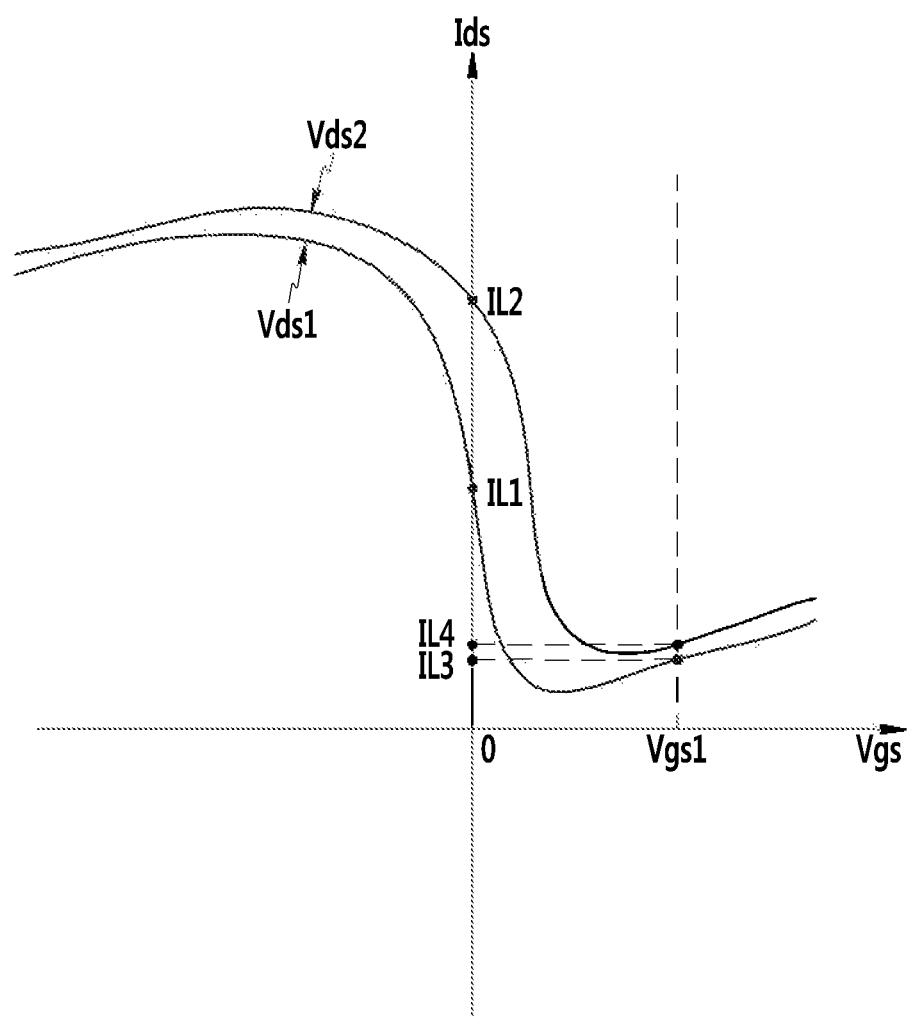
FIG. 5 shows an exemplary diagram of a leakage current of a transistor according to a voltage applied to a drain, a source, and a gate.

FIG. 5 is a graph for showing a current (Ids) that flows between a drain and a source of a transistor according to a voltage (Vgs) at a gap of the gate and the source of the transistor. As the transistor down-sizes, a distance (a length of the gate) between the drain and the source is reduced, causing a short channel effect can occur. The characteristic of the drain-induced barrier lowering (DIBL), which is one of the short channel effects, lowers a channel barrier of the transistor according to the voltage applied to the drain. When a difference of the voltage (Vgs) between the gate and the source is not big, the leakage current can flow between the drain and the source.

As shown in FIG. 5, when the voltage (Vgs) at the gate-source is about 0 V, a difference of voltage (Vds) at the drain-source occurs so the leakage current is generated to flow between the drain and the source. As the difference of voltage (Vds) at the drain-source is increased from Vds1 to Vds2, the leakage current flowing between the drain and the source is increased from IL1 to IL2.

Therefore, while the transistor is turned off, the leakage current is generated by the difference of the voltage (Vds) between the drain and the source.

At time T3, the input terminal (IN) electrically connected to the source of the third transistor TR3 and the first clock signal input terminal CK1 electrically connected to the gates of the third and fourth transistors TR3 and TR4 are at the disable level. The second node N2 electrically connected to the drain of the fourth transistor TR4 has a voltage that is lower than the low voltage (VGL), so that it is similar to the case when the Vgs of FIG. 5 is about 0 V and Vds is about 18 V (Vds2.)

Here, the current Ids flowing to respective terminals of the third and fourth transistors TR3 and TR4 electrically connected in series can have the value of IL2.

Therefore, the leakage current flows to the respective terminals of the third and fourth transistors TR3 and TR4 and the voltage at the second node N2 can be increased. The second transistor TR2 must be completely turned on to change the voltage at the output terminal (OUT) to the low voltage (VGL), but the voltage at the second node N2 electrically connected to the gate of the second transistor TR2 is increased by the leakage current. Therefore, the second transistor TR2 is not turned on completely and it is difficult to output the scan signal (scan[1]) with an accurate and stable waveform to the output terminal (OUT) of the scan driver 200.

However, the fifth transistor TR5 is turned on at T3 and transmits the second voltage (VGL) to the electrical connection point between the third transistor TR3 and the fourth transistor TR4, so that the second voltage (VGL) is applied to the drain of the third transistor TR3 and the source of the fourth transistor TR4.

Regarding an operation of the fourth transistor TR4 with reference to FIG. 5, about −7 V is applied to the source of the fourth transistor TR4, about −12 V is applied to the drain thereof, and about 6 V is applied to the gate thereof. Therefore, Vgs is changed from about 0 V to Vgs1, and Vds is changed from about 18 V (Vds2) to about 5 V (Vds1). Then, Ids can be changed from IL2 to IL3. That is, the leakage current of the fourth transistor TR4 is reduced by the second voltage (VGL) applied to the source of the fourth transistor TR4.

In a like manner, regarding the operation of the third transistor TR3 with reference to FIG. 5, about 6 V is applied to the source of the third transistor TR3, about −7 V is applied to the drain thereof, and about 6 V is applied to the gate thereof. Therefore, Vds is changed from about 18 V (Vds2) to about 13 V (Vds1.)

Then, Ids can be changed from IL2 to IL1. That is, the leakage current of the third transistor TR3 is reduced by the second voltage (VGL) applied to the drain of the third transistor TR3.

At time T3, the second clock signal CK2 is changed to the enable level and the eleventh transistor TR11 is turned on. The first input terminal (VGH) electrically connected to the source of the eighth transistor TR8 and the first node N1 electrically connected to the gates of the eighth and ninth transistors TR8 and TR9 are at the disable level. The second node N2 electrically connected to the drain of the ninth transistor TR9 has a voltage that is lower than the low voltage (VGL). This is similar to the case when the Vgs of FIG. 5 is about 0 V and Vds is about 18 V (Vds2).

Here, Ids flowing to respective terminals of the eighth and ninth transistors TR8 and TR9 electrically connected in series can have the value of IL2.

Therefore, the leakage current flows to the respective terminals of the eighth and ninth transistors TR8 and TR9 to increase the voltage at the second node N2. The second transistor TR2 must be completely turned on to change the voltage at the output terminal (OUT) to the low voltage (VGL), but the voltage at the second node N2 electrically connected to the gate of the second transistor TR2 is increased by the leakage current. So, the second transistor TR2 is not turned on completely and it is difficult to output the scan signal (scan[1]) with an accurate and stable waveform to the output terminal (OUT) of the scan driver 200.

However, the tenth transistor TR10 is turned on at T3 and transmits the second voltage (VGL) to the electrical connection point of the eighth transistor TR8 and the ninth transistor TR9, so that the second voltage (VGL) is applied to the drain of the eighth transistor TR8 and the source of the ninth transistor TR9.

Regarding an operation of the ninth transistor TR9 to which the second voltage (VGL) is applied with reference to FIG. 5, about −7 V is applied to the source of the ninth transistor TR9, about −12 V is applied to the drain thereof, and about 6 V is applied to the gate thereof. Therefore, Vgs is changed from about 0 V to Vgs1, and Vds is changed from about 18 V (Vds2) to about 5 V (Vds1). Then, Ids can be changed from IL2 to IL3. That is, the leakage current of the ninth transistor TR9 is reduced by the second voltage (VGL) applied to the source of the ninth transistor TR9.

In a like manner, regarding the operation of the eighth transistor TR8 with reference to FIG. 5, about 6 V is applied to the source of the eighth transistor TR8, about −7 V is applied to the drain thereof, and about 6 V is applied to the gate thereof. Therefore, Vds is changed from about 18 V (Vds2) to about 13 V (Vds1.)

Then, Ids can be changed from IL2 to IL1. That is, the leakage current of the eighth transistor TR8 is reduced by the second voltage (VGL) applied to the drain of the eighth transistor TR8.

At time T5, the scan start signal (FLM) maintains the disable level. When the first clock signal CK1 is switched to the enable level, the third and fourth transistors TR3 and TR4 and the sixth and seventh transistors TR6 and TR7 are turned on.

As the third and fourth transistors TR3 and TR4 are turned on, the disable-level scan start signal (FLM) is transmitted to the second node N2 to change the second node N2 to the high voltage.

As the sixth and seventh transistors TR6 and TR7 are turned on, the second voltage (VGL) is transmitted to the first node N1 to change the first node N1 to the low voltage.

The first node N1 is changed to the low voltage to turn on the eighth and ninth transistors TR8 and TR9, but transmission of the first voltage (VGH) to the input terminal (IN) can be prevented since the eleventh transistor TR11 is turned off.

During T5 and T6, the enable-level scan signal (scan[2]) can be output in the next stage SR2.

At time T7, when the enable-level second clock signal CK2 is applied, the eleventh transistor TR11 is turned on and the first voltage (VGH) is transmitted to the second node N2 to maintain the second node N2 at the high voltage.

As described above, the scan driving device (or scan driver) according to the exemplary embodiment can reduce the effects of DIBL on the transistor, and can supply accurate and stable enable-level scan signals to the display unit 500 of the display device.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the above detailed description is not to be interpreted as being restrictive, but is to be considered as being illustrative. The scope of the present invention is to be determined by reasonable interpretation of the claims, and all alterations within equivalences of the present invention fall within the scope of the present invention.

What is claimed is:

1. A scan driver comprising:
   a plurality of stages each configured to output a scan signal to a corresponding scan line, wherein each stage includes:
   a first transistor electrically connected between a first voltage input terminal configured to receive a first voltage and an output terminal configured to output the scan signal, wherein the first transistor comprises a gate electrode electrically connected to a first node;
   a second transistor electrically connected between the output terminal and a second clock signal input terminal and having a gate electrode electrically connected to a second node;
   third and fourth transistors electrically connected in series between an input terminal configured to receive an input signal and the second node, wherein each of the third and fourth transistors comprises a gate electrode electrically connected to a first clock signal input terminal; and
   a fifth transistor having first and second electrodes and a gate electrode electrically connected to the second node, wherein the first electrode is electrically connected between the third and fourth transistors, and wherein the second electrode is electrically connected to a second voltage input terminal configured to receive a second voltage.

2. The scan driving device of claim 1, further comprising: sixth and seventh transistors electrically connected in series between the second voltage input terminal for receiving a second voltage and the first node, wherein each of the sixth and seventh transistors comprise a gate electrode electrically connected to the first clock signal input terminal.

3. The scan driving device of claim 2, further comprising: eighth and ninth transistors electrically connected in series between the first voltage input terminal and the second node, wherein each of the eighth and ninth transistors comprises a gate electrode electrically connected to the first node; and
a tenth transistor having first and second electrodes and a gate electrode electrically connected to the second node, wherein the first electrode is electrically connected between the eighth and ninth transistors, and wherein the second electrode is electrically connected to the second voltage input terminal.

4. The scan driving device of claim 3, further comprising: an eleventh transistor electrically connected between the ninth transistor and the second node and having a gate electrode electrically connected to the second clock signal input terminal.

5. The scan driving device of claim 1, further comprising: a twelfth transistor electrically connected between the first node and the first clock signal input terminal and having a gate electrode electrically connected to the second node.

6. The scan driving device of claim 1, further comprising: a first capacitor electrically connected between the output terminal and the second node.

7. The scan driving device of claim 1, further comprising: a second capacitor electrically connected between the first voltage input terminal and the first node.

8. The scan driving device of claim 1, wherein each stage is further configured to output the scan signal when the input signal and the first clock signal have an enable voltage level during a first period and the second clock signal have the enable voltage level during a second period.

9. The scan driving device of claim 1, wherein an output terminal of a selected stage is electrically connected to an input terminal of the next stage.

10. A display device comprising:
    a display unit comprising a plurality of pixels each electrically connected to a corresponding scan line; and
    a scan driver comprising a plurality of stages each configured to output a scan signal to the corresponding scan line, wherein each stage includes:
    a first transistor electrically connected between a first voltage input terminal configured to receive a first voltage and an output terminal configured to output the scan signal, wherein the first transistor comprises a gate electrode electrically connected to a first node;
    a second transistor electrically connected between the output terminal and a second clock signal input terminal and having a gate electrode electrically connected to a second node;
    third and fourth transistors electrically connected in series between an input terminal configured to receive an input signal and the second node, wherein each of the third and fourth transistors comprises a gate electrode electrically connected to a first clock signal input terminal; and
    a fifth transistor having first and second electrodes and a gate electrode electrically connected to the second node, wherein the first electrode is electrically connected between the third and fourth transistors, and wherein the second electrode is electrically connected to a second voltage input terminal configured to receive a second voltage.

11. The display device of claim 10, wherein each stage further comprises sixth and seventh transistors electrically connected in series between the second voltage input terminal and the first node, and wherein each of the sixth and seventh transistors comprises a gate electrode electrically connected to the first clock signal input terminal.

12. The display device of claim 11, wherein each stage further comprises:
   eighth and ninth transistors electrically connected in series between the first voltage input terminal and the second node, wherein each of the eighth and ninth transistors comprises a gate electrode electrically connected to the first node; and
   a tenth transistor having first and second electrodes and a gate electrode electrically connected to the second node, wherein the first electrode is electrically connected between the eighth and ninth transistors, and wherein the second electrode is electrically connected to the second voltage input terminal.

13. The display device of claim 12, wherein each stage further comprises an eleventh transistor electrically connected between the ninth transistor and the second node and having a gate electrode electrically connected to the second clock signal input terminal.

14. The display device of claim 10, wherein each stage further comprises a twelfth transistor electrically connected between the first node and the first clock signal input terminal and having a gate electrode electrically connected to the second node.

15. The display device of claim 10, wherein each stage further comprises a first capacitor electrically connected between the output terminal and the second node.

16. The display device of claim 10, wherein each stage further comprises a second capacitor electrically connected between the first voltage input terminal and the first node.

17. The display device of claim 10, wherein, each stage is further configured to output the scan signal when the input signal and the first clock signal have an enable voltage level during a first period and the second clock signal have the enable voltage level during a second period.

18. The display device of claim 10, wherein the output terminal of a selected stage is electrically connected to the input terminal of a next stage.

19. The display device of claim 10, further comprising:
   a power voltage supplier configured to supply the first and second voltages to the scan driver.

20. The display device of claim 10, further comprising:
   a timing controller electrically connected to the scan driver and configured to i) receive an image signal, a data enable signal, horizontal and vertical synchronizing signals, and a main clock signal, and ii) output an image data signal and first and second control signals based at least in part on the received signals; and
   a data driver electrically connected to the pixels through a plurality of data lines and configured to receive the image data signal from the timing controller,
   wherein the timing controller is configured to control i) the scan driver based at least in part on the first control signal and ii) the data driver based at least in part on image data signal and the second control signal.

* * * * *